(12) United States Patent
Dantin et al.

(10) Patent No.: US 9,888,604 B2
(45) Date of Patent: Feb. 6, 2018

(54) SUPPORT RACK FOR AT LEAST ONE ITEM OF AIRCRAFT ELECTRONICS, CORRESPONDING SUPPORT DEVICE AND AIRCRAFT

(71) Applicants: Airbus Operations (S.A.S.), Toulouse (FR); Airbus Operations GmbH, Hamburg (DE)

(72) Inventors: Benoit Dantin, Epinay-sur-Seine (FR); Serge Senac, Eaunes (FR); Bernard Guirado, Saubens (FR); Philippe Pedoussaut, Mauzac (FR); Sylvain Carrere, Hamburg (DE)

(73) Assignees: Airbus Operations (S.A.S.), Toulouse (FR); Airbus Operations GmbH, Hamburg (DE)

( * ) Notice: Subject to any disclaimer, the term of this patent is extended or adjusted under 35 U.S.C. 154(b) by 57 days.

(21) Appl. No.: 14/951,914

(22) Filed: Nov. 25, 2015

(65) Prior Publication Data
US 2016/0150664 A1    May 26, 2016

(30) Foreign Application Priority Data
Nov. 26, 2014 (FR) .................................. 14 61467

(51) Int. Cl.
H05K 7/14 (2006.01)
(52) U.S. Cl.
CPC ............ H05K 7/1412 (2013.01); H05K 7/14 (2013.01)
(58) Field of Classification Search
CPC ........ H05K 7/14; H05K 7/1412; B64D 43/00; B64D 9/003

USPC .................................................. 244/1 R, 131
See application file for complete search history.

(56) References Cited

U.S. PATENT DOCUMENTS

| 2,917,266 A | * | 12/1959 | Sanborn | F16M 5/00 248/507 |
| 3,035,806 A | * | 5/1962 | Hamer | H05K 7/1412 248/503 |
| 3,816,935 A | * | 6/1974 | Wilmot | G01C 25/00 33/228 |

(Continued)

FOREIGN PATENT DOCUMENTS

| DE | 102008030640 | 1/2010 |
| FR | 2881607 | 8/2006 |

OTHER PUBLICATIONS

French Search Report cited in FR 1461467, completed Oct. 7, 2015, six pages.

*Primary Examiner* — Patrick Hawn
(74) *Attorney, Agent, or Firm* — Nixon & Vanderhye P.C.

(57) ABSTRACT

A support rack configured for an aircraft including: a rectangular frame including four substantially straight segments and four feet, wherein upper surfaces of each of the substantially straight segments and the four feet are substantially aligned with a upper plane of the rectangular frame; a first set of attachment holes configured to attach at least one item of aviation electronic equipment, wherein the first set of holes are in the upper surfaces of the straight segments or the, and a second set of attachment holes configured to receive anchoring elements that anchor to a structure of the aircraft, wherein the second set of attachment holes are at a surface of the rack out of the substantially upper planar.

14 Claims, 4 Drawing Sheets

(56) References Cited

U.S. PATENT DOCUMENTS

| | | | | |
|---|---|---|---|---|
| 4,458,296 A * | 7/1984 | Bryant | H05K 7/1412 | 361/691 |
| 4,470,199 A * | 9/1984 | Krezak | G01C 25/00 | 33/366.12 |
| 4,562,978 A * | 1/1986 | Durbin | B64D 43/00 | 244/1 R |
| 4,845,591 A * | 7/1989 | Pavie | H05K 7/1412 | 211/26 |
| 4,882,655 A * | 11/1989 | Pavie | H05K 7/1412 | 292/115 |
| 5,129,594 A * | 7/1992 | Pease | H05K 7/1412 | 174/541 |
| 5,170,320 A * | 12/1992 | Pease | H05K 7/20554 | 277/642 |
| 6,513,755 B1 * | 2/2003 | Lambiaso | B64D 9/003 | 211/168 |
| 6,797,879 B2 * | 9/2004 | Leyda | H05K 7/20563 | 174/153 G |
| 8,262,026 B2 * | 9/2012 | Jaeger | H05K 7/1412 | 244/118.2 |
| 8,770,520 B2 * | 7/2014 | Robrecht | H02G 3/0456 | 244/119 |
| 8,814,087 B2 * | 8/2014 | Koschberg | B64D 11/04 | 244/118.5 |
| 8,888,423 B2 * | 11/2014 | Rose | H05K 7/1412 | 410/81 |
| 9,433,114 B2 * | 8/2016 | Hilburn | H05K 7/1489 | |
| 9,433,118 B2 * | 8/2016 | Senatori | G06F 1/186 | |
| 9,475,583 B2 * | 10/2016 | Burd | B64D 11/04 | |
| 2004/0050569 A1 * | 3/2004 | Leyda | H05K 7/20563 | 174/50 |
| 2010/0188831 A1 * | 7/2010 | Ortet | H01R 12/52 | 361/788 |
| 2011/0215203 A1 * | 9/2011 | Rose | H05K 7/1412 | 244/131 |
| 2012/0025024 A1 * | 2/2012 | Robrecht | H02G 3/0456 | 244/131 |
| 2015/0282377 A1 * | 10/2015 | Hilburn | H05K 7/1489 | 248/213.2 |
| 2016/0029506 A1 * | 1/2016 | Franklin | H05K 7/1488 | 211/26 |
| 2016/0150669 A1 * | 5/2016 | Weber | H05K 7/183 | 211/26 |

* cited by examiner

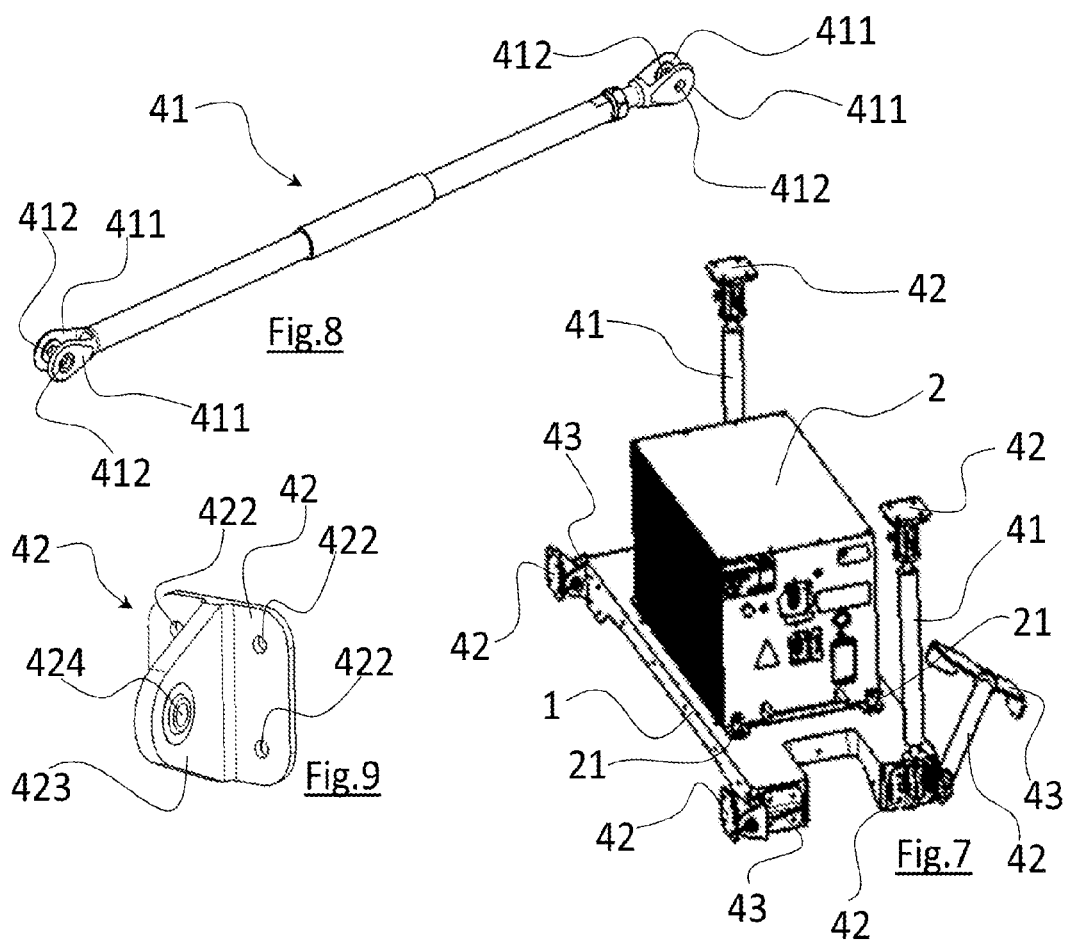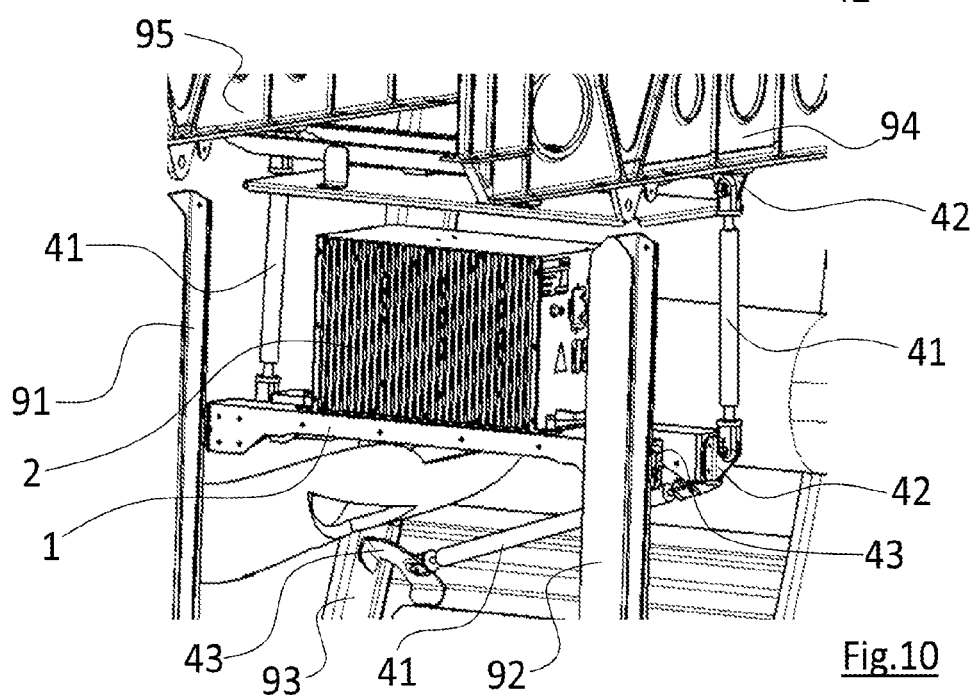

SUPPORT RACK FOR AT LEAST ONE ITEM OF AIRCRAFT ELECTRONICS, CORRESPONDING SUPPORT DEVICE AND AIRCRAFT

RELATED APPLICATION

This application claims priority to French patent application 1461467 filed on Nov. 26, 2014, the entirety of which is incorporated by reference.

BACKGROUND

The present invention relates to the field of aeronautics. It relates in particular to the attachment of items of electronic equipment to the structure of an aircraft.

Aircraft, and in particular airplanes, comprise numerous items of electronic equipment. This equipment can be spread over numerous zones of the aircraft. This electronic equipment comprises housings, containing electronic components, which must be attached to the structure of the aircraft. The limited space on board an aircraft, and the constraints due in particular to the large amount of equipment installed in this space, mean that the various housings of items of electronic equipment are in various positions with respect to the structural elements. Moreover, the housings containing the items of electronic equipment are themselves of various dimensions and configurations.

Consequently, each item of electronic equipment present in an aircraft is generally attached to the structure of the aircraft via the intermediary of an intermediate rack specially designed for this function, which can on one hand be attached to predetermined points on the structure of the aircraft, via the intermediary of anchoring elements, and can on the other hand support the housing of the item of electronic equipment in a predetermined position with respect to this structure. This intermediate rack generally consists of an assembly of numerous parts. Being designed specifically to support a particular item of electronic equipment, the cost of the intermediate rack e is relatively high. Moreover, since each item of electronic equipment of the aircraft has to be mounted on a specific intermediate rack, assembling the aircraft requires a large number of parts of different types, making this assembly complicated and costly.

SUMMARY OF THE INVENTION

A support rack has been invented and is disclosed herein for attaching the items of electronic equipment to the structure of the aircraft which solves all or some of the problems discussed above. The support rack reduces the number of different types of parts needed to form racks needed to support electronic equipment in an aircraft.

The inventive support rack may comprise: a rectangular frame formed by four substantially straight segments and having an substantially planar upper surface; and feet having an substantially planar upper surface, extending in the same plane as the upper surface of the rectangular frame, each of the feet being joined via one of its ends to a corner of the frame, and extending in a direction forming an angle between 90° and 180° with the directions of the segments of the frame forming this corner; the rack having a first set of holes for attaching at least one item of electronic equipment, which are made in the upper surface of the rectangular frame and/or of the feet, and at least one second set of attachment holes for elements for anchoring to the structure of the aircraft, which are made in another surface of the rack.

The support rack makes supports an item of electronic equipment chosen from among many items of electronic equipment of different types. Identical racks of this type may therefore be used to support many different items of electronic equipment in the aircraft.

The support rack includes a segmented frame. At least two of segments of the frame, which are mutually parallel, are each formed by two branches of a frame segment, each connected to one of said feet and joined to one another. The dimensions of the frame may be modified, depending on the relative position of the branches when they are joined. The two branches are joined to one another by a sliding connection and by means for blocking the sliding of said sliding connection. The frame and feet may form a one-piece assembly.

A support device has been invented and is disclosed herein for at least one item of aircraft electronics, comprising: at least one support rack as described hereinabove; and at least one element(s) for anchoring to the structure of the aircraft; the anchoring element(s) being attached to the rack via the intermediary of attachment means passing through holes of said second set of holes of the rack. The support device may include two identical racks, as described hereinabove, secured to one another in such a position that the upper surfaces of the frames of the racks extend in the same plane.

This support device, with its racks, supports multiple items of electronic equipment, or one single item of equipment which is too large to be supported by a single rack.

According to one advantageous embodiment, the support device comprises at least two identical support racks, as described hereinabove, secured to one another via the intermediary of at least two spacers, in such a position that the upper surfaces of the frames of said racks extend in parallel planes.

The invention also relates to an aircraft, comprising at least two different items of electronic equipment each joined to the structure of the aircraft via the intermediary of a support device as described hereinabove, the various support devices employing identical racks.

SUMMARY OF THE FIGURES

Other features and advantages will emerge from the following description of the invention, which description is provided purely by way of example, and with reference to the appended drawings, in which:

FIG. 7 shows a first embodiment of a support device for an item of aircraft electronics according to the invention, employing the rack shown in FIG. 1;

FIG. 8 shows a rod employed in the support device of FIG. 7;

FIG. 9 shows an anchoring foot employed in the support device of FIG. 7;

FIG. 10 shows the support device of FIG. 7 joined to the structure of an aircraft;

DETAILED DESCRIPTION

Figure 1:
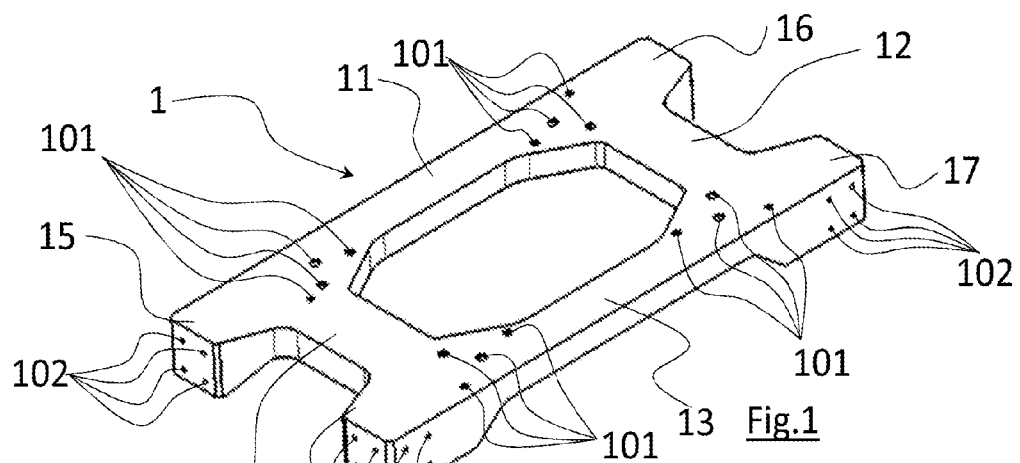
FIG. 1 is a view of a support rack for an item of aircraft electronics according to a first embodiment of the invention.
Figure 2:
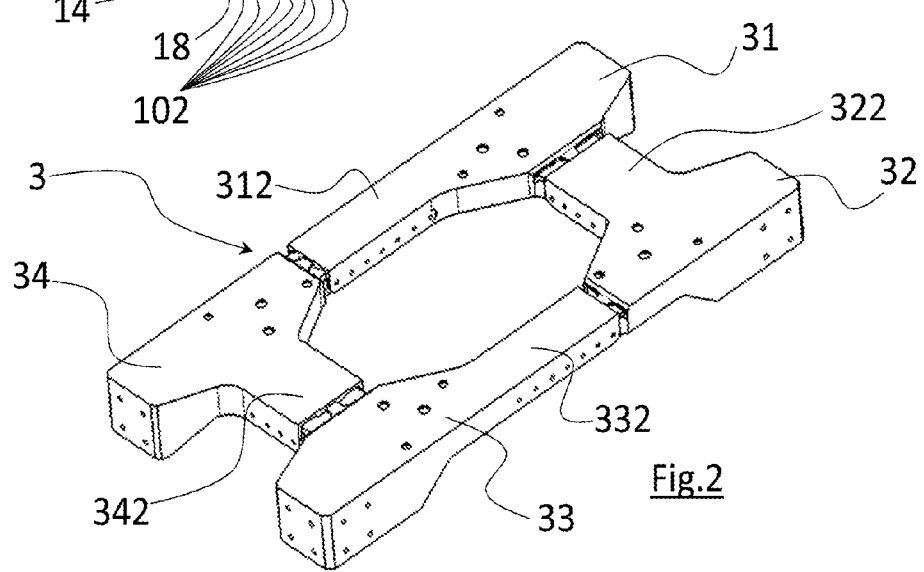
FIG. 2 is a view of a support rack for an item of aircraft electronics according to a second embodiment of the invention, in a first use position.
Figure 3:
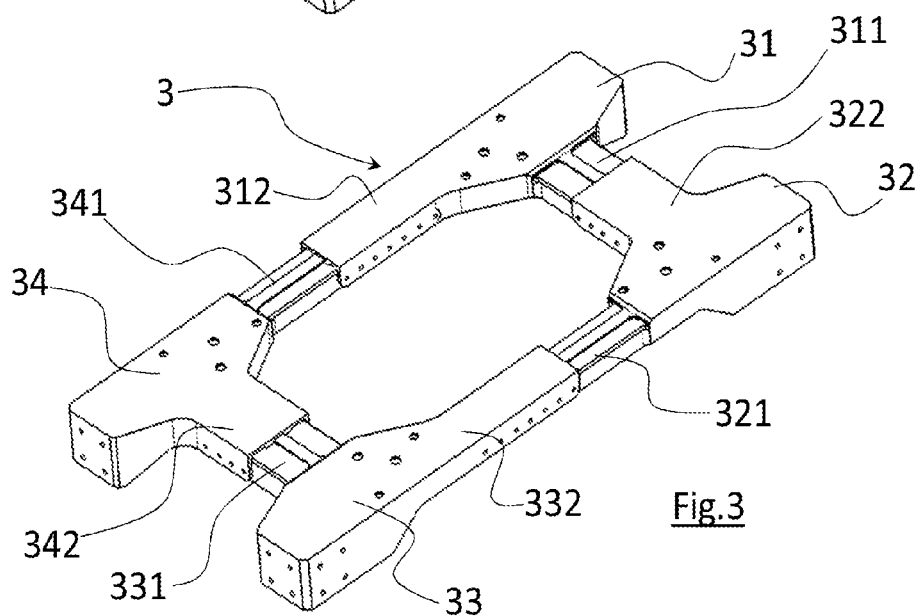
FIG. 3 is a view of the support rack of FIG. 2, in a second use position.

FIG. 1 shows a support rack 1 having a rectangular frame formed by four substantially straight segments 11, 12, 13 and 14, and by four feet 15, 16, 17 and 18 extending from the four corners of the frame. The frame and the feet extend substantially in the same plane, so as to provide an substantially planar upper support surface. Each of the four feet extends in a direction forming an angle between 90° and 180° with the directions of the two segments of the frame forming the corner of the frame where it is attached. In the embodiment shown, these feet are oriented in line with the longest segments 11 and 13 of the rectangular frame.

The rack 1 has a set of holes 101 which are made in the segments 11, 12, 13 and 14 of the frame or in the feet 15, 16, 17 and 18, in a direction substantially perpendicular to the plane defined by the upper support surface. These holes 101 (for the sake of clarity, the holes 101 are referenced only in FIG. 1) are designed to receive attachment means, of the screw or bolt type, by means of which it is possible to attach the housings of the items of electronic equipment of the aircraft. The particular shape of the rack 1 allows the holes 101 to be distributed such that holes 101 are placed facing the positions of the attachment means of the housings of items of electronic equipment, for the most part items of electronic equipment used on an aircraft.

Figure 6:
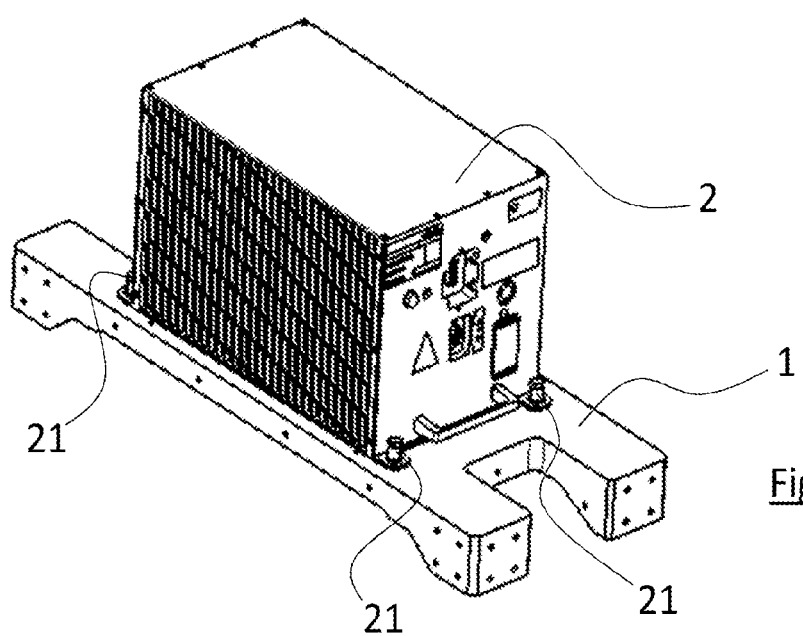
FIG. 6 is a view of the support rack of FIG. 1 on which is mounted an item of electronic equipment.

Thus, FIG. 6 shows the rack 1 supporting the housing 2 of an item of electronic equipment, which is placed on the planar upper face of the rack 1, and is attached there by bolts 21 passing through holes 101 of the rack 1 and through holes created in attachment feet of the housing 2.

Thus, the plurality of holes 101 makes it possible to attach, to the rack 1, any item of electronic equipment from among a plurality of items of electronic equipment having housings of different sizes, which are to be installed in the aircraft. This same rack 1 may thus be used in the support devices in the aircraft of a large number of different items of electronic equipment. It is thus possible, by using the rack 1 for mounting a large number of different items of electronic equipment, to considerably limit the diversity of parts used for manufacturing the aircraft. This rack thus makes it possible to reduce the stock of parts necessary for assembling the aircraft. Moreover, with numerous identical racks being used in each aircraft, it is possible to mass-produce them in larger numbers than the racks of the prior art, which were suitable for just one type of electronic equipment. Their manufacturing cost can thus be better controlled.

The rack 1 also has sets of holes 102 which are made in surfaces of the four feet 15, 16, 17 and 18, substantially perpendicular to the plane defined by the upper support surface (for the sake of clarity, the holes 102 are referenced only in FIG. 1). These holes 102 are designed to receive attachment means, such as screws, bolts or rivets, by means of which it is possible to attach, to the rack 1, elements for anchoring the rack 1 to the structure of the aircraft.

FIG. 7 shows a support device for an item of aircraft electronics using the rack 1 shown in FIG. 1. This rack 1 supports the housing 2 of an item of electronic equipment, which is attached to the planar upper face of the rack 1 by means of bolts 21 passing through holes 101 of the rack 1.

The support device includes anchoring elements allowing it to be attached to the structure of the airplane. These anchoring elements comprise in particular adjustable-length rods 41, such as that shown in FIG. 8, and anchoring feet such as the anchoring foot 42 shown in FIG. 9. The rods 41 have, at each of their ends, two parallel legs 411 having aligned holes 412 through which it is possible to pass an attachment pin. The anchoring feet 42 have a base 421 in which there are provided four screw holes 422, and a body 423 in which there is provided a hole 424 though which an attachment pin can pass. This hole can be a simple hole or can be provided in a ball swivel borne by the body 423.

Anchoring feet 42 are attached to the rack 1 via the intermediary of screws passing through the holes 422 of the anchoring foot 42 and the holes 102 of the rack. Other anchoring feet 43 of different models may be attached to the rack via the intermediary of other holes 102 of the rack.

These anchoring feet may be connected to the first ends of the rods 41, via the intermediary of attachment pins passing through the holes 412 of the rods and the holes 424 of the anchoring feet. In this case, the second end of each rod can be connected to a second anchoring foot 42 or 43, which can itself be attached to the structure of the aircraft. The length of the rods 41 can be adjustable, by virtue of a system of screws well known to a person skilled in the art. An anchoring foot 43 attached to the rack 1 may also be directly connected to a complementary anchoring foot 42, which can itself be attached to the structure of the aircraft.

Thus, the anchoring elements consisting in particular of the anchoring feet 42, 43, 44 and the rods 41 make it possible to easily attach the support device to the structure of the aircraft, at points of this structure which are close to the rack 1 or points further away from this rack 1. FIG. 10 thus shows the support device of FIG. 7 joined to structural elements of an aircraft. This device is joined, via the intermediary of anchoring feet 42 and 43 to vertical struts 91 and 92 passing close to the rack 1, and also by joining rods 41 and anchoring feet 42 and 43, to struts 93, 94 and 95 remote from this rack 1.

Figure 11:
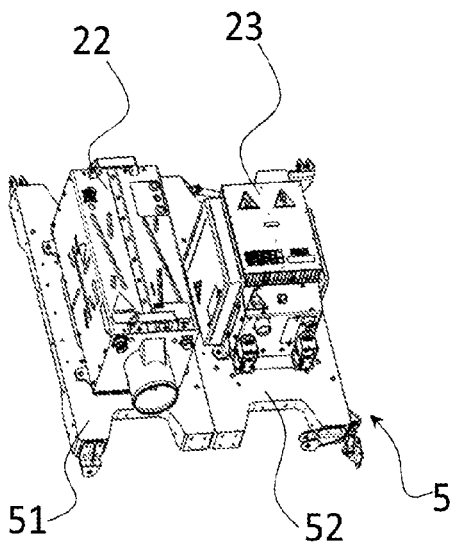
FIG. 11 shows a second embodiment of a support device for at least one item of aircraft electronics according to the invention, employing two racks.
Figure 12:
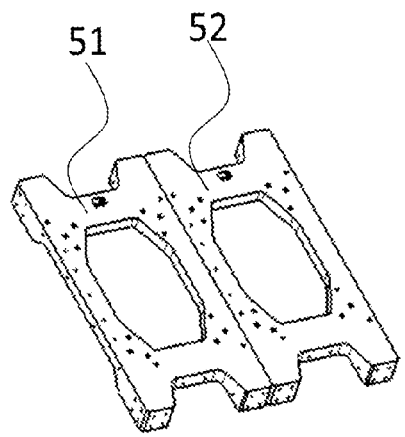
FIG. 12 shows the two racks employed in the support device of FIG. 11.

FIG. 11 shows a support device for at least one item of aircraft electronics according to another embodiment of the invention. This support device 5 employs two racks 51 and 52, which are identical to the rack 1 shown in FIG. 1. These two racks, which are shown in FIG. 12, are joined to one another by connection elements such as bolts or rivets passing through holes 102 of the racks. The racks are joined in this manner such that the upper support surfaces of the two racks are in the same plane.

The support device thus created makes it possible to provide a large support surface, consisting of the upper support surfaces of the two racks 51 and 52, in order to support multiple housings 22 and 23 of items of electronic equipment, or one large housing.

This support device 5 also comprises anchoring elements, similar to those described previously, by means of which it is possible to join the two racks 51 and 52 to the structure of the airplane.

Figure 13:
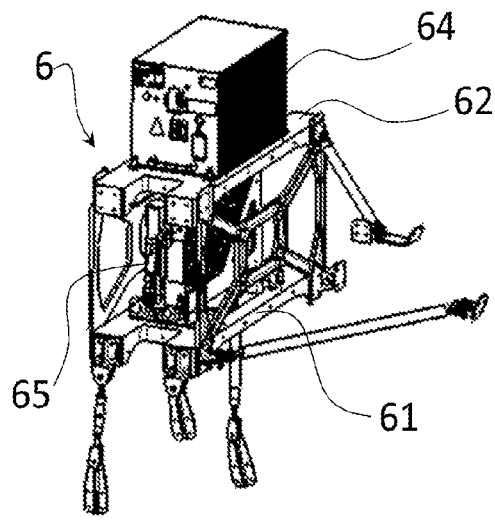
FIG. 13 shows a third embodiment of a support device for two items of aircraft electronics according to the invention, employing two racks.
Figure 14:
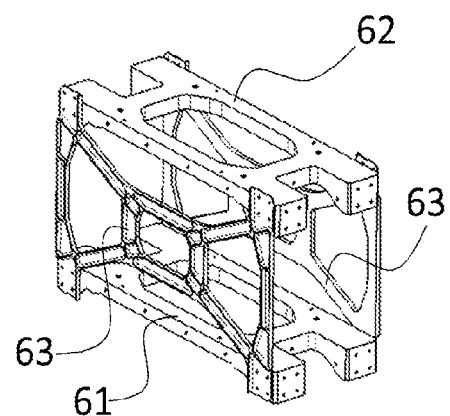
FIG. 14 shows the two racks employed in the support device of FIG. 13, joined by spacers.

FIG. 13 shows a support device for two items of aircraft electronics according to another embodiment of the invention. This support device 6 employs two racks 61 and 62, identical to the rack 1 shown in FIG. 1. These two racks, which are shown in FIG. 14, are held one above the other by two lateral spacers 63, such that their upper faces extend in substantially parallel planes.

The lateral spacers 63 are joined by connection elements such as bolts or rivets passing through holes 102 of the racks. The support device thus created makes it possible to support multiple housings 64 and 65 of items of electronic equipment. This support device also comprises anchoring elements, similar to those described previously, by means of which it is possible to join it to the structure of the airplane.

FIGS. 2 to 5 show a modular rack 3 according to another possible embodiment of the invention. This rack has, like the rack 1, a rectangular frame formed by four substantially straight segments, and four feet joined to the four corners of the frame. Like the rack 1, it has an upper surface designed to receive an item of electronic equipment and pierced with holes 101 (not referenced in FIGS. 2 to 5), and its lateral edges are pierced with holes 102 (not referenced in FIGS. 2 to 5).

Unlike the embodiment shown in FIG. 1, this rack 3 is not formed in one piece. On the contrary, the rack 3 consists of four rack portions 31, 32, 33 and 34, which each form one foot connected to two frame segment branches. More precisely, each of these rack portions 31, 32, 33 and 34 comprises a first frame segment branch, respectively 311, 321, 331 and 341, which has an outer shape in the form of a male slider, and a second frame segment branch, respectively 312, 322, 332 and 342, which has an internal shape in the form of a female slideway.

Figure 5:
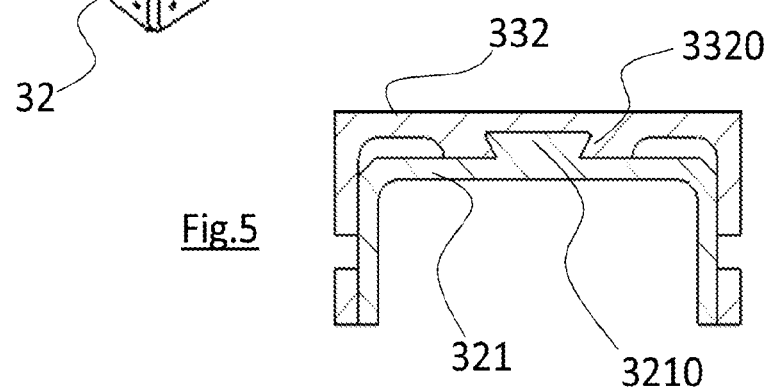
FIG. 5 is a section through a segment of the support rack of FIG. 2.

Each first branch has a shape complementary with a second branch of another rack portion, in order to provide a slideway-slider connection between two rack portions. As shown in FIG. 5, which shows a transverse section through the first branch 321 of the rack portion 32 and through the second branch 332 of the rack portion 33, the slideway-slider connection can be provided by a dovetail join between these two branches, the first branch 321 having a male dovetail shape 3210 and the second branch 332 having a female dovetail shape 3320. Thus, the four rack portions 31, 32, 33 and 34 can be joined by slideway-slider connections to form the frame of the rack 3.

Since the slideway-slider connection allows the rack portions to move in translation with respect to one another, the frame of the rack 3 may adopt multiple configurations in which it has different dimensions. The position of the rack portions can be blocked by blocking screws, such that the rack 3 becomes rigid, with a frame having the desired dimensions.

The rack 3 may thus be modified very easily so that its dimensions match the dimensions of the item of electronic equipment which it is intended to support. It is thus very easy to modify the length and/or the width of this rack 3 such that it can receive an item of electronic equipment of a given size. This modification may also make it possible to make the position of the holes 101 of this rack coincide with the position of the attachment points of the item of electronic equipment. Such a modular rack 3 of adjustable dimension can be employed in the same conditions as the modular rack 1 presented previously. It may thus be employed in all the support devices described in the present patent application, instead of the modular rack 1.

Of course, variants of this rack 3 may be employed by a person skilled in the art. It is thus possible, for example, for only two of the frame segments, which are mutually parallel, to each consist of two branches joined to one another. In this case, the dimensions of the rack may be modified only in one direction. Other types of join between the rack branches may also be employed. Such a join may for example be effected via the intermediary of spacers. In this case, the choice of the length of the spacer makes it possible to determine the dimensions of the rack.

Figure 4:
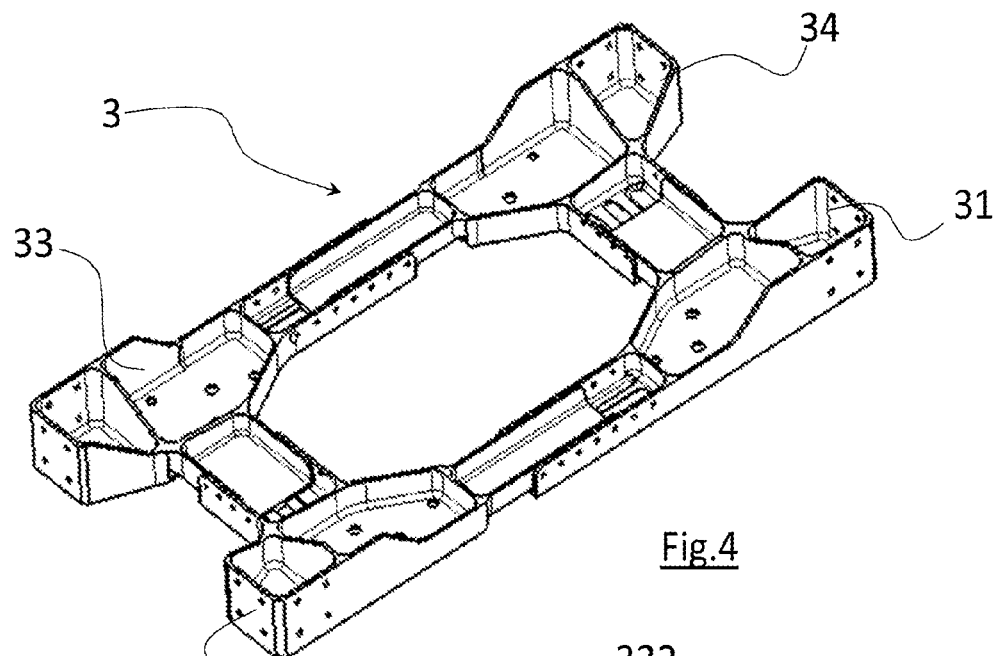
FIG. 4 is a view of the support rack of FIG. 2, in a third use position.

FIG. 4 shows a view from below of the rack 3. As shown in this Figure, this rack is a hollow structure, preferably obtained by casting or machining of aluminum. It is to be noted that, advantageously, the rack portions 31 and 33 are identical, as are the portions 32 and 34. It is thus possible to manufacture the rack 3 with a reduced number of part references.

A person skilled in the art may easily imagine other possible embodiments of the invention, such that it is possible to manufacture support devices suited to the installation of items of electronic equipment of various models, at various locations in the aircraft, using a standardized rack.

Figure 15:
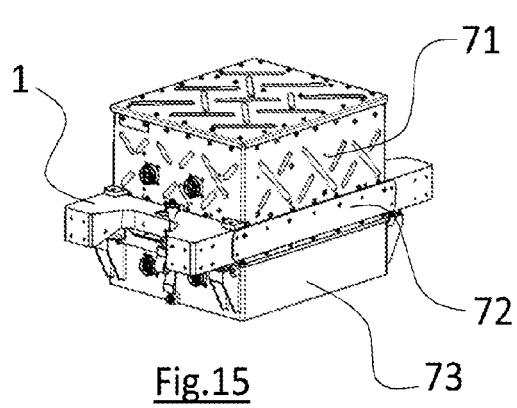
FIG. 15 shows the rack of FIG. 1 onto which are joined two items of electronic equipment.
Figure 16:
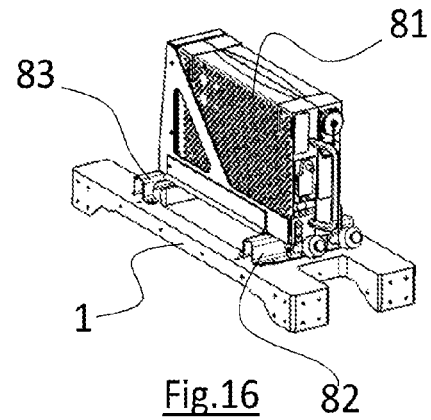
FIG. 16 shows the rack of FIG. 1 onto which is joined one item of electronic equipment.

Various variants for attaching the items of electronic equipment to the rack may be imagined by a person skilled in the art. Thus, FIG. 15 shows a rack 1 on which is mounted a first item of electronic equipment 71. A support structure 72, attached by means of screws to the lateral edges of the rack 1, makes it possible to suspend a second item of electronic equipment 73 below this rack 1. FIG. 16 shows a rack 1 on which an item of electronic equipment 81 is attached via the intermediary of spacers 82 and 83, which are themselves attached to the upper face of the rack 1.

The invention also relates to an aircraft comprising at least two different items of electronic equipment, each of these items of electronic equipment being joined to the structure of the aircraft via the intermediary of an identical rack according to one of the embodiments of the invention, some of the holes of the rack being used for means for attaching the housing to the rack to pass through, and other attachment holes being used for means for attaching the rack to the structure of the airplane to pass through.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A support rack for at least one item of aircraft electronics, wherein the support rack comprises:
a rectangular frame formed by four essentially straight beam segments and having an essentially planar upper surface; and four feet each having an essentially planar upper surface which is in the essentially planar upper surface of the rectangular frame, wherein each of said feet are joined to a corner of said frame, and each of said feet extend in a direction forming an angle between 90° and 180° with a lengthwise direction of each of the beam segments of said frame forming the corner of the frame, wherein the rectangular frame, the four essentially straight beam segments and the feet are a one-piece assembly;

a first set of holes configured to attach at least one item of electronic equipment to the rectangular frame, wherein the first set of holes are in the essentially planar upper surfaces of said rectangular frame or of said feet, and at least one second set of attachment holes configured to anchor the rectangular frame to the structure of an aircraft, wherein the at least one second set of attachment holes are in a sidewall of one of the beam segments or the feet and in a surface of the support rack out of the essentially planar upper surface and include a first group of holes and a second group of holes such that the first group of holes are a first distance from the upper surface less than a distance between the upper surface and a bottom edge of a narrowest portion of a sidewall of the one of the beam segments and the second group of holes are a second distance from the upper surface greater than the distance between the upper surface and the bottom edge of the narrowest portion of the sidewall of the one of the beam segments.

2. The support rack as claimed in claim 1, wherein at least two of the essentially straight beam segments are parallel to each other, and each of the at least two of the essentially straight beam segments include two branches each connected to one of said feet and the two branches are joined to one another.

3. The support rack as claimed in claim 1, wherein one of the straight beam segments extends along a first axis and two of the feet extend away from opposite ends of the one of the straight beam segments along the first axis, and another one of the straight beam segments extends along a second axis and the other two of the feet extend away from opposite ends of the other one of the straight beam segments along the second axis.

4. The support rack as claimed in claim 1, wherein the four essentially straight beam segments bound an eight-sided opening.

5. A device for supporting at least one item of aircraft electronics comprising:

a support rack including:
a first rectangular frame formed by four essentially straight beam segments and having an essentially planar upper surface; and four feet each having an essentially planar upper surface which is in the essentially planar upper surface of the first rectangular frame, wherein each of said feet are joined to a corner of said frame, and each of said feet extend in a direction forming an angle between 90° and 180° with a lengthwise direction of each the beam segments of said frame forming the corner of the frame, wherein the first rectangular frame, the four essentially straight beam segments and the feet are a one-piece assembly;

a first set of holes configured to attach at least one item of electronic equipment to the first rectangular frame, wherein the first set of holes are in the essentially planar upper surfaces of said first rectangular frame or of said feet, and at least one second set of attachment holes configured to anchor the first rectangular frame to the structure of an aircraft, wherein the at least one second set of attachment holes are in a sidewall of one of the beam segments or the feet and in a surface of the support rack out of the essentially planar upper surface and include a first group of holes and a second group of holes such that the first group of holes are a first distance from the upper surface less than a distance between the upper surface and a bottom edge of a narrowest portion of a sidewall of the one of the beam segments and the second group of holes are a second distance from the upper surface greater than the distance between the upper surface and the bottom edge of the narrowest portion of the sidewall of the one of the beam segments, and an anchoring element configured to anchor to the structure of an aircraft, wherein said anchoring element is attached to said support rack by attachment devices extending from said second set of holes of the first support rack.

6. The support device as claimed in claim 5, wherein the support rack includes a second rectangular frame secured to first rectangular frame, wherein an upper surface of the second rectangular frame is in the essentially planar upper surface of the first rectangular frame.

7. The support device as claimed in claim 5 wherein the support rack includes a second rectangular frame secured to first rectangular frame by at least two spacers, wherein a plane of an upper surface of the second rectangular frame is parallel to the essentially planar upper surfaces of the first rectangular frame.

8. An aircraft including at least two different items of electronic equipment, wherein a support device as recited in claim 5 supports each of the two different items of electronic equipment.

9. A support rack configured for an aircraft, the support rack comprising:

a rectangular frame including four substantially straight beam segments and four feet, wherein upper surfaces of each of the substantially straight beam segments and the four feet are substantially aligned with a upper plane of the rectangular frame, and wherein each of the feet are at a corner of the rectangular frame and the foot at each of the corners extends at a direction forming an angle between ninety and one-hundred eighty degrees with respect to each of the lengthwise directions of the straight beam segments ending at the corner, wherein the rectangular frame, the four essentially straight beam segments and the feet are a one-piece assembly;

a first set of attachment holes configured to attach at least one item of aviation electronic equipment, wherein the first set of holes are in the upper surfaces of the straight beam segments or the feet, and a second set of attachment holes configured to receive anchoring elements that anchor to a structure of an aircraft, wherein the second set of attachment holes are in a sidewall of one of the beam segments or the feet and at a surface of the rack out of the substantially upper planar surface and include a first group of holes and a second group of holes such that the first group of holes are a first distance from the upper surface less than a distance between the upper surface and a bottom edge of a narrowest portion of a sidewall of the one of the beam segments and the second group of holes are a second distance from the upper surface greater than the distance between the upper surface and the bottom edge of the narrowest portion of the sidewall of the one of the beam segments.

10. The support rack of claim 9 wherein at least two of the substantially straight beam segments are parallel and are formed of branch segments each including one of the feet.

11. An electronics equipment support device configured for an aircraft and comprising:
   a support rack including:
      frames each having upper surfaces in a horizontal plane corresponding to the frame, wherein the upper surfaces are configured to support electronics equipment, and each frame include a first pair of beam segments, a second pair of beam segments orthogonal to the first pair, and four feet each at junction between the first and second pairs of beam segments, wherein the frame, the first pair of beam segments, the second pair of beam segments and the feet are a one-piece assembly,
      a first set of attachment holes configured to attach at least one item of aviation electronic equipment, wherein the first set of holes are in the upper surfaces of each of the frames, and
      a second set of attachment holes in each of the frames and configured to receive anchoring elements to anchor the frame to a structure of an aircraft, wherein the second set of attachment holes are in a sidewall of one of the beam segments or the feet and in a surface of the frame out horizontal plane for the frame and include a first group of holes and a second group of holes such that the first group of holes are a first distance from the upper surface less than a distance between the upper surface and a bottom edge of a narrowest portion of a sidewall of the one of the beam segments and the second group of holes are a second distance from the upper surface greater than the distance between the upper surface and the bottom edge of the narrowest portion of the sidewall of the one of the beam segments; and
   an anchoring element configured to anchor to the structure of the aircraft, wherein said anchoring element extends through at least one of the second set of holes.

12. The electronics equipment support device as claimed in claim 11, wherein the second set of attachment holes are configured to fasten together at least two of the frames and the horizontal planes are in the same plane for the at least two of the frames fastened together.

13. The electronics support device as claimed in claim 11, further comprising spacers extending between at least two of the frames, and the second set of attachment holes include holes configured to receive a fastener to affix one of the spacers to the frame, and the horizontal planes are parallel for the at least two of the frames.

14. An aircraft including at least two different items of electronic equipment, wherein a support device as recited in claim 11 that supports each of the two different items of electronic equipment.

* * * * *